US009923560B2

(12) United States Patent
Wang et al.

(10) Patent No.: US 9,923,560 B2
(45) Date of Patent: Mar. 20, 2018

(54) METHOD AND APPARATUS FOR CURRENT/POWER BALANCING

(71) Applicants: TOYOTA MOTOR ENGINEERING & MANUFACTURING NORTH AMERICA, INC., Erlanger, KY (US); VIRGINIA TECH INTELLECTUAL PROPERTIES, INC., Blacksburg, VA (US)

(72) Inventors: Chi-Ming Wang, Ann Arbor, MI (US); Yincan Mao, Blacksburg, VA (US); Zichen Miao, Blacksburg, VA (US); Khai Ngo, Blacksburg, VA (US)

(73) Assignees: Toyota Motor Engineering & Manufacturing North America, Inc., Erlanger, KY (US); VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 0 days.

(21) Appl. No.: 15/097,853

(22) Filed: Apr. 13, 2016

(65) Prior Publication Data
US 2017/0302270 A1    Oct. 19, 2017

(51) Int. Cl.
G05F 3/02 (2006.01)
H03K 17/687 (2006.01)
(52) U.S. Cl.
CPC ........... H03K 17/6871 (2013.01); G05F 3/02 (2013.01)

(58) Field of Classification Search
CPC ... G05F 3/00; G05F 3/02; H01L 27/00; H01L 27/088; H03K 17/00; H03K 17/102; H03K 17/567; H03K 17/6871; H03K 17/6874
USPC ........................................................ 327/436
See application file for complete search history.

(56) References Cited

U.S. PATENT DOCUMENTS

| 8,669,821 | B2 | 3/2014 | Hosoda |
| 9,000,601 | B2 | 4/2015 | Azuma et al. |
| 9,048,722 | B2 | 6/2015 | Sun et al. |
| 2011/0291582 | A1 | 12/2011 | Wei et al. |
| 2013/0001805 | A1* | 1/2013 | Azuma ................. H01L 25/072 257/784 |

* cited by examiner

Primary Examiner — Lincoln Donovan
Assistant Examiner — David Mattison
(74) Attorney, Agent, or Firm — Oblon, McClelland, Maier & Neustadt, L.L.P.

(57) ABSTRACT

Aspects of the disclosure provide a system having a power circuit. The power circuit includes a first switch circuit having at least a first transistor and a second switch circuit having at least a second transistor. Further, the power circuit includes first interconnections configured to couple the first switch circuit to driving nodes, a source node and a drain node of the power circuit, and second interconnection configured to couple the second switch circuit in parallel to the first switch circuit to the driving nodes, the source node and the drain node of the power circuit. A polarity of unbalance in the first interconnections and the second interconnections dominates a polarity of current unbalance in the first switch circuit and the second switch circuit.

19 Claims, 4 Drawing Sheets

METHOD AND APPARATUS FOR CURRENT/POWER BALANCING

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A power module may use parallel power components to increase power capacity. For the parallel power components, equalizing current/power among the power components provides various benefits, such as improving component utilization, saving cost, improving system reliability. In an example, to equalize current/power among parallel power components, U.S. Patent Application Publication 2012/0235663 discloses a driver circuit to provide respective gate driver signals to drive the parallel power components.

SUMMARY

Aspects of the disclosure provide a system having a power circuit. The power circuit includes a first switch circuit having at least a first transistor and a second switch circuit having at least a second transistor. Further, the power circuit includes first interconnections configured to couple the first switch circuit to driving nodes, a source node and a drain node of the power circuit, and second interconnection configured to couple the second switch circuit in parallel to the first switch circuit to the driving nodes, the source node and the drain node of the power circuit. A polarity of unbalance in the first interconnections and the second interconnections dominates a polarity of current unbalance in the first switch circuit and the second switch circuit.

In an embodiment, the polarity of unbalance in the first interconnections and the second interconnections dominates the polarity of current unbalance when a transistor parameter difference between the first transistor and the second transistor is within a range specified in manufacturing specifications. In an example, a first interconnection is configured to couple a source terminal of the first transistor to the source node of the power circuit and a second interconnection is configured to couple a source terminal of the second transistor to the source node of the power circuit. A polarity of unbalance in the first interconnection and the second interconnection dominates the polarity of current unbalance in the first switch circuit and the second switch circuit.

According to an aspect of the disclosure, the power circuit includes a balancing circuit configured to balance current flowing through the first switch circuit and the second switch circuit based on the polarity of current unbalance. In an example, the balancing circuit is formed by mutually inductive-coupling interconnections that are selected from the first interconnections and the second interconnection according to the polarity of unbalance in the first interconnections and the second interconnections.

Aspects of the disclosure provide a method for forming a power circuit. The method includes disposing a first switch circuit and a second switch circuit, coupling the first switch circuit to driving nodes, a source node and a drain node of the power circuit using first interconnections, and coupling the second switch circuit in parallel with the first switch circuit to the driving nodes, the source node and the drain node of the power circuit using second interconnections that are unbalanced from the first interconnects. A polarity of unbalance in the first interconnections and the second interconnections dominates a polarity of current unbalance in the first switch circuit and the second switch circuit.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
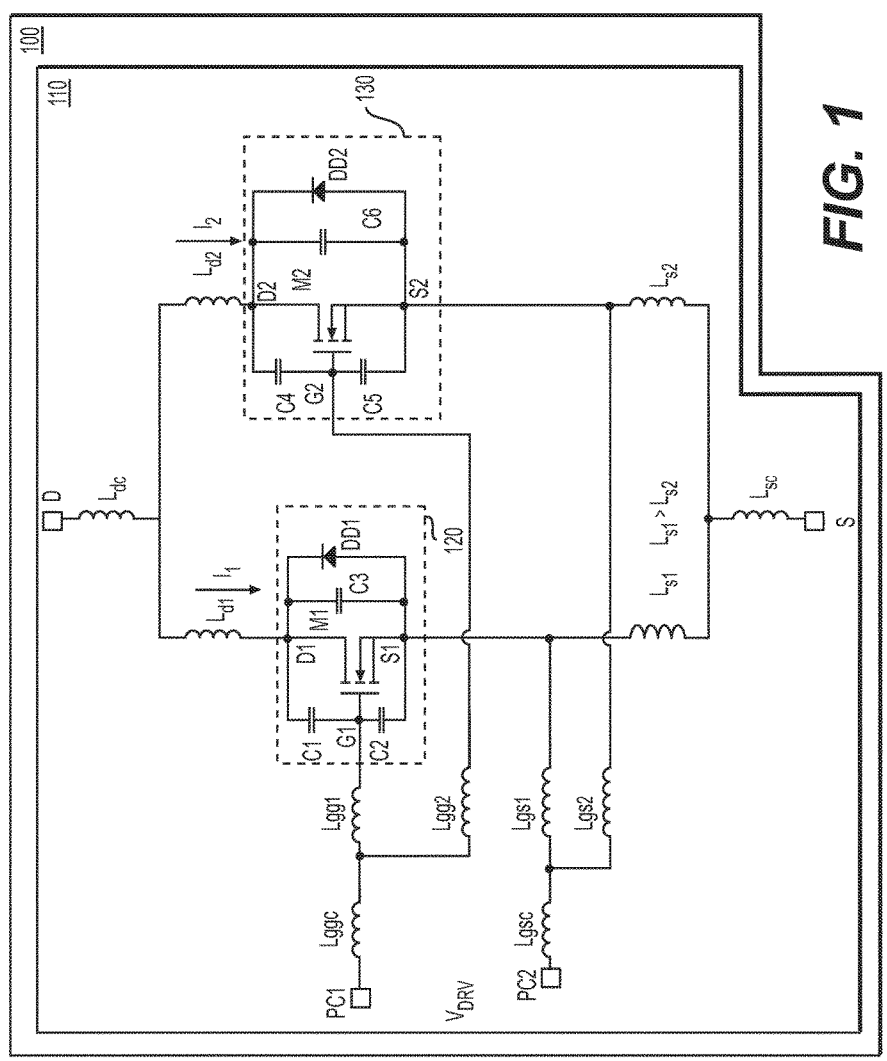
FIG. 1 shows a diagram of a system 100 according to an embodiment of the disclosure.

FIG. 1 shows a block diagram of a system 100 according to an embodiment of the disclosure. The system 100 includes a power module 110 that uses multiple parallel switch circuits, such as a first switch module and a second switch module, to share current/power load. Each of the switch circuits includes at least a transistor. The power module 110 includes interconnection components to couple the switch circuits together to form the power module. The interconnection components are configured to be a dominant source for causing current/power unbalance among the multiple parallel switch circuits. Thus the polarity of the current/power unbalance is consistent with the interconnection components configuration and is certain in spite of other sources, such as transistor parameter variations, and the like that can cause current/power unbalance. Further, in an embodiment, a simplified current/power balancing technique is implemented in the power module 110 according to the polarity of the current/power unbalance to balance the current/power load in the power module 110.

The system 100 can be any suitable system that requires a relatively large power, such as a hybrid vehicle, an electric vehicle, a wind energy system, a printing system, and the like. During operation, in an example, the power module 110 needs to provide a relatively large current, such as in the order of Ampere, over ten Amperes, and the like. In an embodiment, the power module 110 is configured to use parallel components to share the relatively large current load.

In an embodiment, the power module 110 includes a power converter circuit, such as a DC-to-AC inverter, an AC-to-DC rectifier, a DC-to-DC converter, and the like, and is implemented using semiconductor switching devices. The semiconductor switching devices form a plurality of switchable current paths to share the current load. According to an aspect of the disclosure, the semiconductor switching devices may have wide parameter variations, such as threshold voltage (Vth) variations, on-resistance Rds(on) variations, and the like due to manufacturing process. The parameter variations can cause current/power unbalance on the plurality of switchable current paths.

According to an aspect of the disclosure, when the polarity of current/power unbalance is not certain, current/power balancing techniques need to balance the current/power under different polarity scenarios, and can be complicated.

In an example, the power module 110 has a first switch module 120 and a second switch module 130 in parallel. The semiconductor switching device parameter variation can cause bipolar current/power unbalance that the current/power unbalance can have different polarity scenarios, such as a first polarity scenario in which the first switch module 120 conducts a larger transient current than the second switch module 130 at a switch-on time, and a second polarity scenario in which the second switch module 130 conducts a larger transient current than the first switch module 120 at a switch-on time. The current/power balancing techniques need to balance the current/power load under both the first polarity scenario and the second polarity scenario, and can be relatively complicated.

It is noted that the components shown in FIG. 1 are a portion of the power module 110. The power module 110 can include additional components that are not shown. In an example, the power module 110 includes another two switch modules (not shown) that are similar configured as the first and second switch modules 120 and 130. The other two switch modules can be coupled to the first and second switch modules 120 and 130 in series to form a half-bridge circuit.

According to the disclosure, the power module 110 is configured to be unipolar unbalance such that the polarity of current/power unbalance is certain. For example in spite of the uncertainty in the semiconductor switching device parameter variations, the second switch module 130 conducts a larger current than the first switch module 120. Thus, the current/power balancing techniques can be simplified to balance the current/power under one polarity scenario.

Specifically, in the FIG. 1 example, the power module 110 includes two driving nodes PC1 and PC2 to receive a control signal $V_{DRV}$. Further, the power module 110 includes a drain node D and a source node S. In an example, the drain node D and the source node S are connected to a power source. The power module 110 conducts a current flowing from the drain node D to the source node S in response to the control signal $V_{DRV}$.

According to an aspect of the disclosure, the power module 110 includes a plurality of switch modules, such as the first switch module 120, the second switch module 130 and the like. The switch modules are arranged in parallel and coupled to the driving nodes PC1 and PC2, the drain node D and the source node S using interconnection components, such as wirebonds, busbars and the like. The switch modules are configured to switch on/off current paths between the drain node D and the source node S based on the control signal $V_{DRV}$ received at the driving nodes PC1 and PC2.

Each switch module can include one or more transistors. When multiple transistors are used in a switch module, the multiple transistors can be arranged in various topologies to act as a switch.

Specifically, in the FIG. 1 example, the first switch module 120 includes a first transistor M1, and the second switch module 130 includes a second transistor M2. The first transistor M1 and the second transistor M2 can be any suitable transistors, such as metal-oxide-semiconductor field effect transistors (MOSFET) and the like. In an example, the first transistor M1 and the second transistor M2 are SiC MOSFET transistors that may have relatively wide parameter variations due to manufacturing process.

It is noted that real transistors can possess various parasitic elements, and are generally modeled using equivalent circuits in simulation. In the FIG. 1 example, the first transistor M1 has a gate terminal G1, a source terminal S1 and a drain terminal D1, and is modeled using a transistor model, capacitors C1-C3, and a body diode DD1 coupled together as shown in FIG. 1. Similarly, the second transistor M2 has a gate terminal G2, a source terminal S2 and a drain terminal D2, and is modeled using a transistor model, capacitors C4-C6 and a body diode DD2 coupled together as shown in FIG. 1.

According to an aspect of the disclosure, the terminals of the first transistor M1 and the second transistor M2 are coupled to the driving nodes PC1-PC2, the drain node D, and the source node S by interconnection components, and the interconnection components introduce parasitic inductances that influence the switching operation of the power module 110. The interconnection components can be modeled using inductances. For example, in the FIG. 1 example, the interconnection components between the driving node PC1 and the gate terminals G1 and G2 are modeled using inductances $L_{ggc}$, $L_{gg1}$, and $L_{gg2}$ coupled together as shown in FIG. 1; the interconnection components between the driving node PC2 and the source terminals S1 and S2 are modeled using inductances $L_{gsc}$, $L_{gs1}$, and $L_{gs2}$ coupled together as shown in FIG. 1; the interconnection components between the source node S and the source terminals S1 and S2 are modeled using inductances $L_{sc}$, $L_{s1}$, and $L_{s2}$ coupled together as shown in FIG. 1; the interconnection components between the drain node D and the drain terminals D1 and D2 are modeled using inductances $L_{dc}$, $L_{d1}$, and $L_{d2}$ coupled together as shown in FIG. 1.

According to an aspect of the disclosure, the interconnection components are configured to make current/power in the power module 110 to be unipolar unbalanced. The polarity of current/power unbalance is consistent with the interconnection component configuration and is not affected by other current/power unbalance sources, such as the semiconductor parameter variations, and the like.

In an example, threshold voltage difference is one of the semiconductor switching device parameters that can cause current/power unbalance in the power module 110. For example, the first transistor M1 has a first threshold voltage, the second transistor M2 has a second threshold voltage, and the first threshold voltage and the second threshold voltage can be different due to manufacturing process. The threshold voltage difference can cause current/power unbalance. In an embodiment, the first transistor M1 and the second transistor M2 are tested in a chip manufacturing facility to satisfy manufacturing process specifications. However, at an assembling facility to fabricate the power module 110, the first transistor M1 and the second transistor M2 are not individually tested by the assembling facility in order to save time to market and testing cost. The polarity of current/power unbalance caused by the threshold voltage difference between the first transistor M1 and the second transistor M2 can be uncertain. In the example, the interconnection components are configured to out-power the threshold voltage difference to make the polarity of current/power unbalance to be certain and consistent with the interconnection component configuration.

For example, the chip manufacturing facility generally fabricates transistors according to manufacturing process specifications, thus transistor variations, such as a threshold voltage variation of the transistors is controlled in a threshold voltage range that is specified in the manufacturing process specifications. In an embodiment, the interconnection components are purposely unbalanced to out-power possible threshold voltage difference according to the manufacturing process specifications, such that the interconnection component configuration is the dominant source to cause the current/power unbalance, thus the polarity of current/power unbalance is certain and is consistent with the interconnection component configuration.

It is noted that any suitable portion of the interconnection components can be suitably unbalanced to out-power the threshold voltage difference. In the FIG. 1 example, the interconnection components between the source node S and the source terminals S1 and S2 are purposely unbalanced to make the polarity of current/power unbalance to be certain.

In an example, the interconnection components between the driving node PC1 and the gate terminals G1 and G2 are balanced, such that the inductances $L_{gg1}$ and $L_{gg2}$ are about the same. The interconnection components between the driving node PC2 and the source terminals S1 and S2 are balanced, such that inductances $L_{gs1}$ and $L_{gs2}$ are about the same. The interconnection components between the drain node D and the drain terminals D1 and D2 are balanced, such that the inductances $L_{d1}$ and $L_{d2}$ are about the same. However, the interconnection components between the source node S and the source terminals S1 and S2 are purposely unbalanced, such that the inductance $L_{s1}$ is different from the inductance $L_{s2}$.

In an embodiment, during the layout design of the power module 110, designers receive manufacturing specifications that are used to fabricate transistors to be used in the power module 110, and design the interconnection components between the source node S and the source terminals S1 and S2 based on the manufacturing process specifications, such as a threshold voltage range specified in the manufacturing process specifications. The transistors to be assembled in the power module 110 are fabricated according to the manufacturing process specifications. The designers can suitably design the inductances $L_{s1}$ and $L_{s2}$, such that the current/power unbalance caused by the interconnection unbalance can out-power the current/power unbalance caused by other possible current unbalance sources, such as threshold voltage difference and the like, and thus the current/power unbalance is dominated by the inductance design for $L_{s1}$ and $L_{s2}$, the polarity of the current/power unbalance is consistent with the interconnection component configuration.

Specifically, in the FIG. 1 example, the interconnection component between the source node S and the source terminal S1 is purposely designed to introduce the first inductance $L_{s1}$, the interconnection component between the source node S and the source terminal S2 is purposely designed to introduce the second inductance $L_{s2}$. The first inductance $L_{s1}$ is designed to be larger than the second inductance $L_{s2}$. The unbalance between the first inductance $L_{s1}$ and second inductance $L_{s2}$ are designed to be the dominant current/power unbalance source over other possible current/power unbalance sources, such as the threshold voltage variation and the like, thus the polarity of the current/power unbalance can be determined by the unbalance between the first inductance $L_{s1}$ and the second inductance $L_{s2}$. For example, during a switch operation, a first current $I_1$ flows through the first switch module 120 and a second current $I_2$ flows through the second switch module 130. The first current $I_1$ is smaller than the second current $I_2$ due to the unbalance between inductances $L_{s1\ and}\ L_{s2}$.

Further, according to an aspect of the disclosure, the power module 110 uses a simplified current balance implementation to balance the current flowing through the first switch module 120 and the second switch module 130. It is noted that when a related power module has a bipolar current/power unbalance, a current/power balancing technique needs to be implemented to balance current under different polarity scenarios to achieve current/power balance, and the implementation can be complicated. When the power module 110 has a unipolar current/power unbalance, the current/power balancing technique is implemented to balance current under one polarity scenario, thus the implementation is simplified. It is noted that the power module 110 can use any suitable current/power balancing technique.

Figure 2:
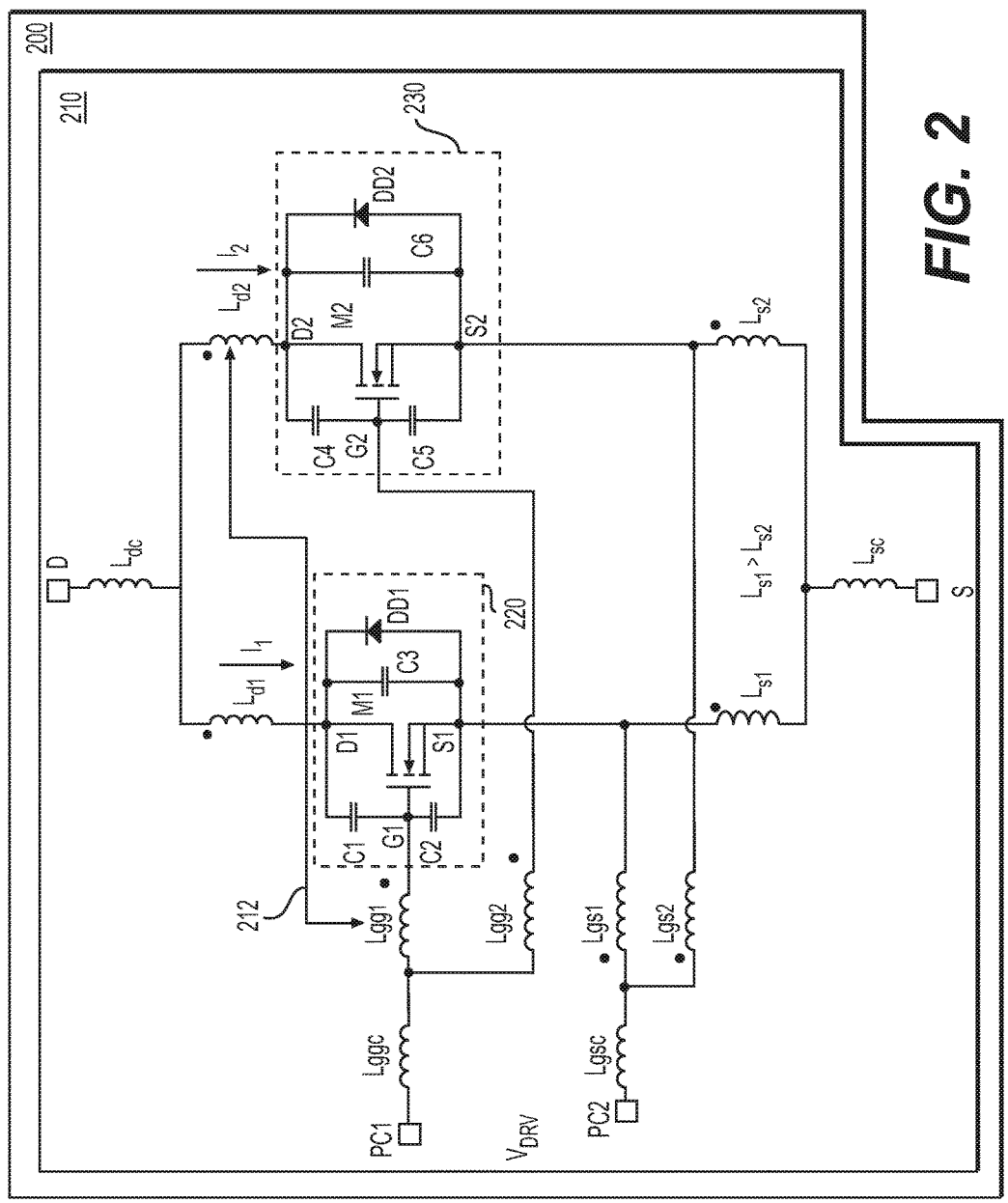
FIG. 2 shows a diagram of a system 200 according to an embodiment of the disclosure.

FIG. 2 shows a diagram of a system 200 according to an embodiment of the disclosure. The system 200 includes a power module 210 that operates similarly to the power module 110 described above. The power module 210 utilizes certain components that are identical or equivalent to those used in the power module 110; the description of these components has been provided above and will be omitted here for clarity purposes.

Similarly to the power module 110, the interconnection components in the power module 210 are configured to make the current/power in the power module 210 to be unipolar unbalanced. The polarity of current/power unbalance is consistent with the interconnection component configuration and is not affected by other current/power unbalance sources, such as the semiconductor parameter variations, and the like.

Specifically, the interconnection component between the source node S and the source terminal S1 is purposely designed to introduce the first inductance $L_{s1}$, the interconnection component between the source node S and the source terminal S2 is purposely designed to introduce the second inductance $L_{s2}$. The first inductance $L_{s1}$ is designed to be larger than the second inductance $L_{s2}$. The unbalance between the first inductance $L_{s1}$ and second inductance $L_{s2}$ are designed to be the dominant current/power unbalance source over other possible current/power unbalance sources, such as the threshold voltage variation and the like, thus the polarity of the current/power unbalance can be determined by the unbalance between the first inductance $L_{s1}$ and the second inductance $L_{s2}$. For example, during a switch operation, a first current $I_1$ flows through the first switch module 220 and a second current $I_2$ flows through the second switch module 230. The first current $I_1$ is smaller than the second current I2 due to the unbalance between inductances $L_{s1}$ and $L_{s2}$.

In the FIG. 2 example, an inductance coupling technique is implemented to balance current/power in the power module 210. The inductance coupling technique is disclosed in Applicant's co-pending application Ser. No. 15/009,867 filed on Jan. 29, 2016, which is incorporated herein by reference in its entirety. Due to the unipolar current unbalance in the power module 210, the inductance coupling technique is simplified. Specifically, in the FIG. 2 example, the direction of the drain inductance (e.g., the direction of $L_{d1}$ and $L_{d2}$) and the direction of the gate inductance (e.g., the direction of $L_{gg1}$ and of first and second transistors M1 and M2 make the drain inductance and the gate inductance in the directly coupled state assuming positive coupling coefficient). In order to have a negative feedback to reduce the current/power unbalance for the directly coupled state, the drain inductance $L_{d2}$ of the second switch module 230 is cross coupled to the gate inductance $L_{gg1}$ of the first switch module 220 with a positive coupling coefficient, such as 0.9 and the like.

During operation, when the first switch module 220 and the second switch module 230 are switched on to conduct current, due to the larger inductance $L_{s1}$ compared to the inductance $L_{s2}$, the second drain current $I_2$ flowing through the second switch module 230 increases faster and is larger than the first drain current $I_1$ flowing through the first switch module 220. When the second drain current $I_2$ increases, the coupling of the drain inductance $L_{d2}$ and the gate inductance $L_{gg1}$ can cause an increase in the gate voltage on the gate terminal G1. The gate voltage increase on the gate terminal G1 can then increase the first drain current $I_1$ flowing through the first switch module 220, thus the difference between the first drain current $I_1$ and the second drain current $I_2$ can be reduced.

Figure 3A:
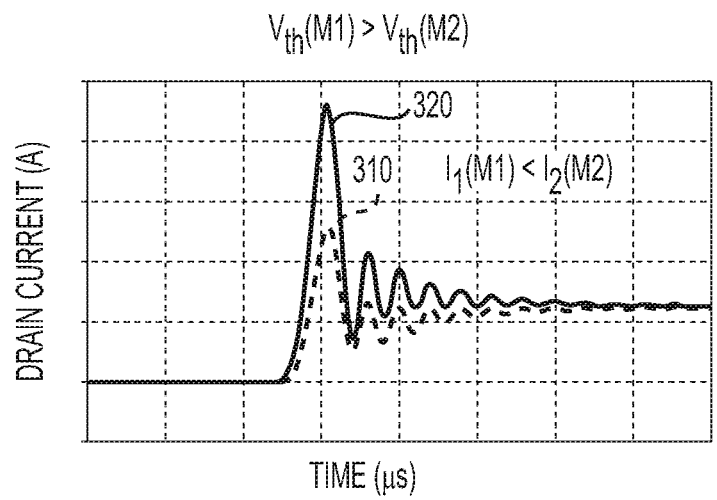
FIGS. 3A-3B show plots of simulation results according to an embodiment of the disclosure.
Figure 3B:
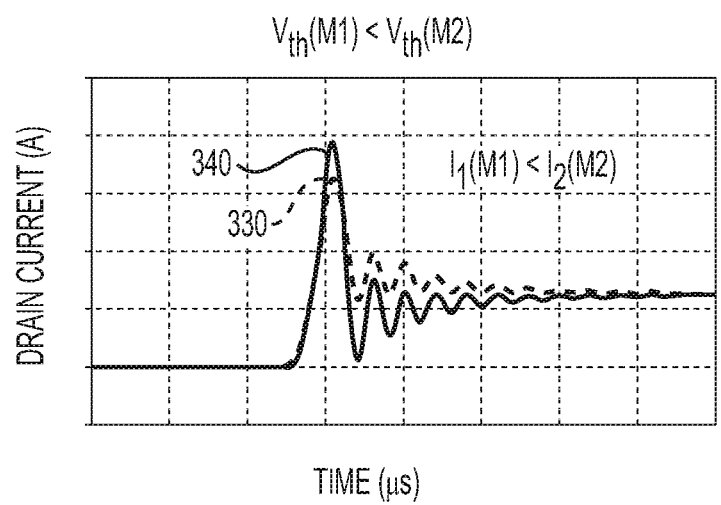

FIGS. 3A-3B show plots of simulation results for the power module 110 according to an embodiment of the disclosure.

FIG. 3A shows drain current during switching for a first simulation when the threshold voltage of the first, transistor $V_{th}(M1)$ is larger than the threshold voltage of the second transistor $V_{th}(M2)$. In FIG. 3A, the X-axis shows time and the Y-axis shows drain current for the switch modules. FIG. 3A includes a first curve 310 for the first drain current $I_1(M1)$ flowing through the first switch module 120, and a second curve 320 for the second drain current $I_2(M2)$ flowing through the second switch module 130. As can be seen in FIG. 3A, due to the larger source inductance $L_1$ and the higher threshold voltage $V_{th}(M1)$, the first drain current $I^1(M1)$ increases slower than the second drain current $I_2(M2)$, and the peak value of the first drain current $I_1(M1)$ is much lower than the peak value of the second drain current $I_2(M2)$. The polarity of drain current unbalance $(I_1(M1)<I_2(M2))$ is consistent with the polarity of the source inductance unbalance $(L_{s1}>L_{s2})$.

FIG. 3B shows the drain current during switching for a second simulation when the threshold voltage of the first transistor $V_{th}(M1)$ is lower than the threshold voltage of the second transistor $V_{th}(M2)$. In FIG. 3B, the X-axis shows time and the Y-axis shows drain current for switch modules. FIG. 3B includes a first curve 330 for the first drain current $I_1(M1)$ flowing through the first switch module 120, and a second curve 340 for the second drain current $I_2(M2)$ flowing through the second switch module 130. As can be seen in FIG. 3B, the unbalance in the source inductance can be designed to out power the threshold voltage mismatch, such that the polarity of the peak transient drain current unbalance $(I_1(M1)<I_2(M2))$ is consistent with the polarity of the source inductance unbalance $(L_{s1}>L_{s2})$.

Figure 4:
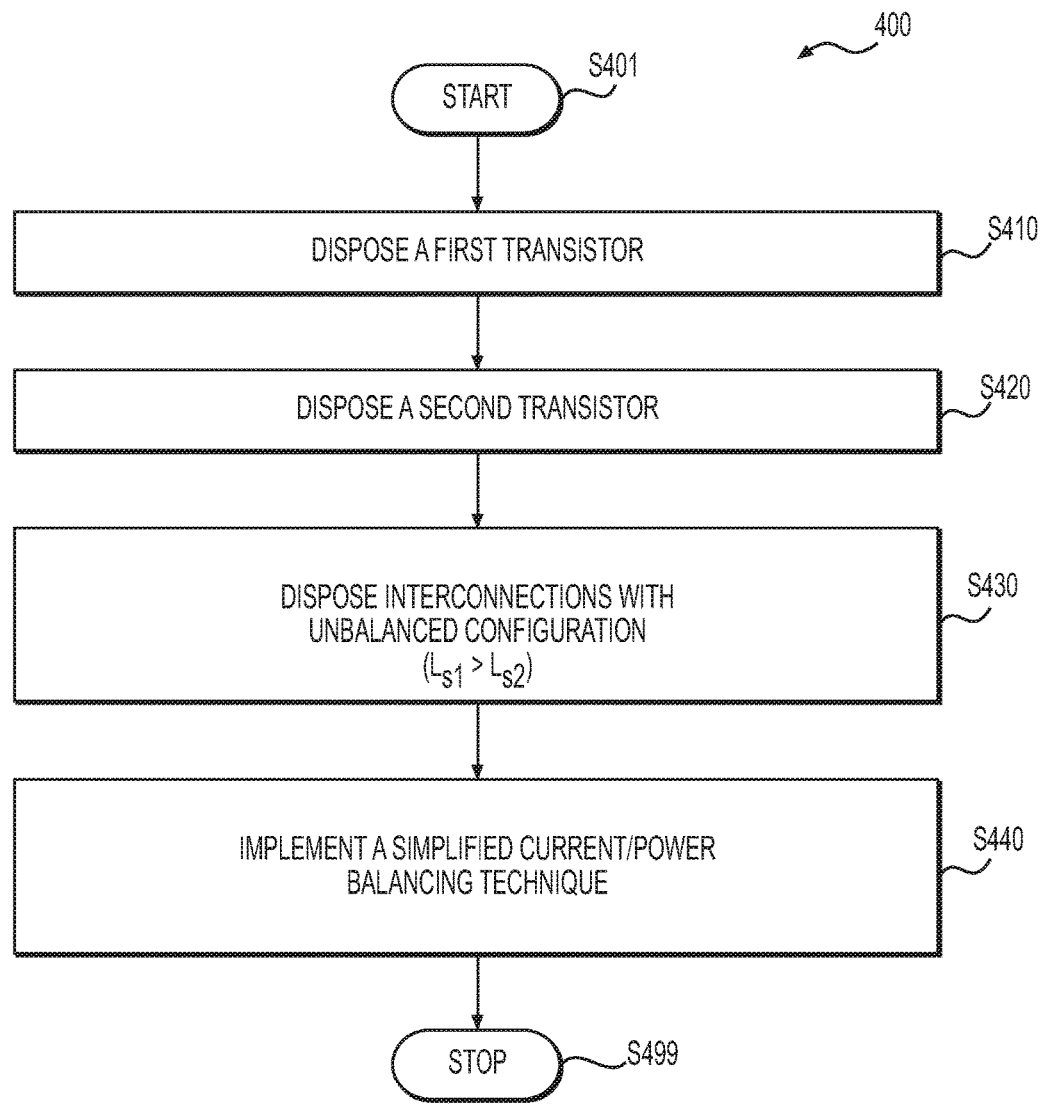
FIG. 4 shows a flow chart outlining a process example 300 according to an embodiment of the disclosure.

FIG. 4 shows a flow chart outlining a process 400 according to an embodiment of the disclosure. In an example, the process 400 is executed to implement the power module 210. The process starts at S401, and proceeds to S410.

At S410, a first transistor is disposed. For example, the first transistor M1 is implemented on a first bare die using the SiC MOSFET technology.

At S420, a second transistor is disposed. For example, the second transistor M2 is implemented on a second bare die using the SiC MOSFET technology. In an example, the first transistor M1 and the second transistor M2 are fabricated by a manufacturing process with specifications that are used to control transistor parameters to stay in ranges specified in the specifications. Thus, in an example, transistors, such as the first transistor M1 and the second transistor M2 are tested after fabrication to satisfy the specifications at a chip manufacturing facility. However, at a power module manufacturing facility, the transistors are not additionally tested before being assembled into the power module 210 to save assembly cost and time to market. Thus, in an example, the polarity of parameter difference (e.g., threshold voltage difference and the like) of the first transistor and the second transistor is not certain at the power module manufacturing facility.

At S430, interconnections are disposed to couple the first and second transistors to other parts of the power module 210 and a portion of the interconnection are purposely unbalanced to out-power the transistor parameter variations to cause the polarity of current power unbalance to be consistent with the polarity of the interconnection unbalance.

In an example, the interconnection components between the driving node PC1 and the gate terminals G1 and G2 are disposed and balanced, such that the inductances $L_{gg1}$ and $L_{gg2}$ are about the same. The interconnection components between the driving node PC2 and the source terminals S1 and S2 are disposed and balanced, such that inductances $L_{gs1}$ and $L_{gs2}$ are about the same. The interconnection components between the drain node D and the drain terminals D1 and D2 are disposed and balanced, such that the inductances $L_{d1}$ and $L_{d2}$ are about the same. However, the interconnection components between the source node S and the source terminals S1 and S2 are purposely unbalanced, such that the inductance $L_{s1}$ is different from the inductance $L_{s2}$.

In an embodiment, during the layout design of the power module 210, designers design the interconnection components between the source node S and the source terminals S1 and S2 based on the ranges of transistor parameters that are specified in the specifications of the manufacturing process, such that the current/power unbalance caused by the interconnection unbalance can out-power the current/power unbalance caused by possible transistor parameter variations between the first transistor and the second transistor, and thus the polarity of the current/power unbalance is certain and is consistent with the polarity of the interconnection unbalance.

Specifically, in the FIG. 2 example, the interconnection component between the source node S and the source terminal S1 is designed to introduce the first inductance $L_{s1}$, and the interconnection component between the source node S and the source terminal S2 is designed to introduce the second inductance $L_{s2}$. The first inductance $L_{s1}$ is larger than the second inductance $L_{s2}$. The unbalance between the inductances $L_{s1}$ and $L_{s2}$ are designed to be the dominant current/power unbalance source over other possible current/power unbalance sources, such as the threshold voltage variation, thus the polarity of the current/power unbalance can be determined by the unbalance between the inductances $L_{s1}$ and $L_{s2}$. For example, during a switch operation, the first current $I_1$ flows through the first switch module 220 and the second current $I_2$ flows through the second switch module 230. The first current $I_1$ is smaller than the second current I2 due to the unbalance between inductances $L_{s1}$ and $L_{s2}$.

At S440, a simplified current/power balancing technique is implemented. In the FIG. 2 example, in order to have a negative feedback to reduce the current/power unbalance for the power module 210, the drain inductance $L_{d2}$ of the second switch module 230 is mutual inductively cross coupled to the gate inductance $L_{gg1}$ of the first switch module 220 with a positive coupling coefficient, such as 0.9 and the like. Then the process proceeds to S499 and terminates.

It is noted that the process 400 can include other suitable steps to implement a power module. Further, the steps in the process 400 can be executed at the same time or in a different order.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A power circuit, comprising:
   a first switch circuit having at least a first transistor;
   a second switch circuit having at least a second transistor;
   first interconnections configured to couple the first switch circuit to driving nodes, a source node and a drain node of the power circuit; and
   second interconnections configured to couple the second switch circuit parallel with the first switch circuit to the driving nodes, the source node and the drain node of the power circuit, wherein the first interconnections and the second interconnections are configured to be a dominant source for causing current/power unbalance among the first switch circuit and the second switch circuit such that a polarity of the current/power unbalance is consistent with configurations of the first and second interconnections in spite of other source including at least transistor parameter variations causing current/power unbalance.

2. The power circuit of claim 1, wherein the first interconnections and the second interconnections are configured to be the dominant source for causing the current/power unbalance when a transistor parameter difference between the first transistor and the second transistor is within a range specified in manufacturing specifications.

3. The power circuit of claim 1, wherein
   a first interconnection is configured to couple a source terminal of the first transistor to the source node of the power circuit;
   a second interconnection is configured to couple a source terminal of the second transistor to the source node of the power circuit; and
   an unbalance between the first interconnection and the second interconnection is a dominant source for causing current/power unbalance among the first switch circuit and the second switch circuit.

4. The power circuit of claim 1, further comprising:
   a balancing circuit configured to balance current flowing through the first switch circuit and the second switch circuit based on the current/power unbalance among the first interconnections and the second interconnections.

5. The power circuit of claim 4, wherein the balancing circuit is formed by mutually inductive-coupling of interconnections selected from the first interconnections and the second interconnections.

6. The power circuit of claim 1, wherein the first transistor and the second transistor are SiC metal-oxide-semiconductor field effect transistors.

7. The power circuit of claim 1, wherein the first switch circuit is on a first die, the second switch circuit is on a second die; and the first die and the second die are assembled in a package to form the power circuit.

8. A method for forming a power circuit, comprising:
   disposing a first switch circuit and a second switch circuit;
   coupling the first switch circuit to driving nodes, a source node and a drain node of the power circuit using first interconnections; and
   coupling the second switch circuit in parallel with the first switch circuit to the driving nodes, the source node and the drain node of the power circuit using second interconnections that are unbalanced from the first interconnections, wherein the first interconnections and the second interconnections are configured to be a dominant source for causing current/power unbalance among the first switch circuit and the second switch circuit such that a polarity of the current/power unbalance is consistent with configurations of the first and second interconnections in spite of other source including at least transistor parameter variations causing current/power unbalance.

9. The method of claim 8, further comprising:
   receiving ranges of the transistor parameter variations in manufacturing specifications that are used to control transistor fabrication; and
   determining, according to the range, the configuration of the first interconnections and the second interconnections to be the dominant source.

10. The method of claim 8, wherein
    coupling a source terminal of a first transistor in the first switch circuit to the source node of the power circuit using a first interconnection having a first inductance; and
    coupling a source terminal of a second transistor in the second switch circuit to the source node of the power circuit using a second interconnection having a second inductance that is different from the first inductance, wherein a polarity of inductance unbalance between the first interconnection and the second interconnection is a dominant source for causing current/power unbalance among the first switch circuit and the second switch circuit.

11. The method of claim 8, further comprising:
    balancing current flowing through the first switch circuit and the second switch circuit based on the current/power unbalance among the first interconnections and the second interconnections.

12. The method of claim 11, further comprising:
    mutual-inductive coupling interconnections selected according to the polarity of unbalance in the first interconnections and the second interconnections.

13. A system having a power circuit, the power circuit comprising:
    a first switch circuit having at least a first transistor;
    a second switch circuit having at least a second transistor; and
    first interconnections configured to couple the first switch circuit to driving nodes, a source node and a drain node of the power circuit; and
    second interconnections configured to couple the second switch circuit in parallel with the first switch circuit to the driving nodes, the source node and the drain node of the power circuit, wherein the first interconnections and the second interconnections are configured to be a dominant source for causing current/power unbalance among the first switch circuit and the second switch circuit such that a polarity of the current/power unbalance is consistent with configurations of the first and second interconnections in spite of other source including at least transistor parameter variations causing current/power unbalance.

14. The system of claim 13, wherein the first interconnections and the second interconnections are configured to be the dominant source for causing the current/power unbalance when a transistor parameter difference between the first transistor and the second transistor is within a range specified in manufacturing specifications.

15. The system of claim 13, wherein
- a first interconnection is configured to couple a source terminal of the first transistor to the source node of the power circuit;
- a second interconnection is configured to couple a source terminal of the second transistor to the source node of the power circuit; and
- an unbalance between the first interconnection and the second interconnection is a dominant source for causing current/power unbalance among the first switch circuit and the second switch circuit.

16. The system of claim 13, further comprising:
- a balancing circuit configured to balance current flowing through the first switch circuit and the second switch circuit according to the current/power unbalance among the first interconnections and the second interconnections.

17. The system of claim 16, wherein the balancing circuit is formed by mutually inductive-coupling interconnections selected from the first interconnections and the second interconnections according to the unbalance in the first interconnections and the second interconnections.

18. The system of claim 13, wherein the first transistor and the second transistor are SiC metal-oxide-semiconductor field effect transistors.

19. The system of claim 13, wherein the first switch circuit is on a first die, the second switch circuit is on a second die, and the first die and the second die are assembled in a package to form the power circuit.

* * * * *